US012660384B2

(12) United States Patent (10) Patent No.: US 12,660,384 B2
Kim et al. (45) Date of Patent: Jun. 16, 2026

(54) HIGH COLOR PURITY MICRO-LED DISPLAY

(71) Applicant: Plessey Semiconductors Ltd, Plymouth (GB)

(72) Inventors: Jun-Youn Kim, Plymouth Devon (GB); Anwer Saeed, Plymouth Devon (GB); Andrea Pinos, Plymouth Devon (GB); Mohsin Aziz, Plymouth Devon (GB); Ian Murray, Plymouth Devon (GB); Abdul Shakoor, Plymouth Devon (GB)

(73) Assignee: Plessey Semiconductors Ltd, Plymouth Devon (GB)

( * ) Notice: Subject to any disclaimer, the term of this patent is extended or adjusted under 35 U.S.C. 154(b) by 482 days.

(21) Appl. No.: 18/030,049

(22) PCT Filed: Oct. 22, 2021

(86) PCT No.: PCT/GB2021/052752
§ 371 (c)(1),
(2) Date: Apr. 3, 2023

(87) PCT Pub. No.: WO2022/090694
PCT Pub. Date: May 5, 2022

(65) Prior Publication Data
US 2023/0369549 A1 Nov. 16, 2023

(30) Foreign Application Priority Data
Oct. 28, 2020 (GB) ...................................... 2017080

(51) Int. Cl.
*H10H 20/851* (2025.01)
*H10H 20/811* (2025.01)
*H10H 20/814* (2025.01)

(52) U.S. Cl.
CPC ...... *H10H 20/8515* (2025.01); *H10H 20/811* (2025.01); *H10H 20/8142* (2025.01); *H10H 20/8512* (2025.01)

(58) Field of Classification Search
CPC ............. H10H 20/8515; H10H 20/811; H10H 20/8142; H10H 20/8512; H10H 20/8514;
(Continued)

(56) References Cited

U.S. PATENT DOCUMENTS

| | | | | |
|---|---|---|---|---|
| 2007/0297750 A1* | 12/2007 | Bass | .................... | G02B 27/017 385/147 |
| 2010/0283074 A1* | 11/2010 | Kelley | .................. | H10H 20/82 438/33 |

(Continued)

FOREIGN PATENT DOCUMENTS

| | | |
|---|---|---|
| CN | 104979486 A | 10/2015 |
| JP | 2012502473 A | 1/2012 |
| JP | 2018502436 A | 1/2018 |

OTHER PUBLICATIONS

International Preliminary Report on Patentability in PCT International Application No. PCT/GB2021/052752 mailed May 11, 2023.
(Continued)

*Primary Examiner* — Mark W Tornow
(74) *Attorney, Agent, or Firm* — Cognition IP, P.C.; Edward Steakley

(57) ABSTRACT

A colour conversion resonator system, comprising: a partially reflective region configured to transmit light of a first primary peak wavelength and to reflect light of a second primary peak wavelength; a further partially reflective region configured to at least partially reflect light with the second primary peak wavelength; and a colour conversion resonator cavity comprising at least one quantum well, wherein the colour conversion resonator cavity is arranged to: receive input light with the first primary peak wavelength
(Continued)

through the partially reflective region; and convert, by the at least one quantum well, at least some of the received input light to provide light of the second primary peak wavelength such that light of the second primary peak wavelength resonates in the cavity and light with the resonant second primary peak wavelength is output through the further partially reflective region, wherein the at least one quantum well is placed to coincide with an antinode of the colour conversion resonator cavity standing wavelength for light of the second primary peak wavelength, thereby enhancing at least one of the intensity, spectral width and directionality of output light with the second primary peak wavelength.

21 Claims, 4 Drawing Sheets

(58) Field of Classification Search
CPC .. H10H 20/855; H10H 20/862; H10H 20/812; H01L 25/0753; H01S 5/18383; H01S 5/18308; H01S 5/34; H10D 62/812; H10F 77/146
See application file for complete search history.

(56) References Cited

U.S. PATENT DOCUMENTS

| | | | | |
|---|---|---|---|---|
| 2011/0150019 A1* | 6/2011 | Leatherdale | ....... | H10H 20/8514 |
| | | | | 372/45.01 |
| 2011/0150020 A1* | 6/2011 | Haase | ..................... | H01S 5/347 |
| | | | | 372/45.01 |
| 2014/0055845 A1* | 2/2014 | Jain | .......................... | G02B 5/20 |
| | | | | 359/344 |
| 2015/0192714 A1 | 7/2015 | Jain | | |
| 2020/0075816 A1* | 3/2020 | Cheng | ................ | H10H 20/8511 |

OTHER PUBLICATIONS

Patents Act 1977: Examination Report under Section 18(3) by Patent Office (GB), mailed Feb. 6, 2023.
Patents Act 1977: Examination Report under Section 18(3) by Patent Office (GB), mailed Jun. 26, 2023.
International Search Report and Written Opinion in PCT International Application No. PCT/GB2021/052752 mailed Feb. 1, 2022.
Combined Search and Examination Report under Sections 17 and 18(3) by Patent Office (GB), mailed Mar. 16, 2021.
Patents Act 1977: Examination Report under Section 18(3) by Patent Office (GB), mailed Nov. 22, 2022.

* cited by examiner

100

116

101a

101b

110

106d 105d
105c

104d

102e

106c

105b

104c

102d

106b

105a

102c

104b

106a

102b

104a

102a

112          $\lambda_{con}/2n$

108

114

HIGH COLOR PURITY MICRO-LED DISPLAY

CROSS-REFERENCE TO RELATED APPLICATIONS

This application is a 35 U.S.C. § 371 U.S. National Stage application of International Application No. PCT/GB2021/052752, filed on Oct. 22, 2021, which claims the benefit of priority of Great Britain Application No. 2017080.9, filed on Oct. 28, 2020, which are incorporated herein by reference in their entirety.

FIELD OF THE INVENTION

The invention relates to colour conversion resonator systems and methods of forming colour conversion resonator systems. In particular, but not exclusively, the invention relates to a colour conversion resonator for high colour purity light emitting diode structures.

BACKGROUND OF THE INVENTION

It is known that light emitting diode (LED) devices provide efficient sources of light for a wide range of applications. LED light sources are used to provide conventional white light, and/or multi-colour light emission. For example, multi-colour light emission can include red, green and/or blue emission suitable for display applications, amongst other colours of light. The desired wavelengths of light provided for by LEDs are typically achieved using a combination of a pump source LED with colour conversion material, such as a phosphor or quantum dots (QDs), for example. Such pump source LEDs generate light with a primary peak wavelength output and stimulate emission of light of a different wavelength in a colour conversion material. For example, blue light nitride material LEDs (emitting light with a primary peak wavelength of approximately 450 nm) are used to provide white colour converted light LED emission. Blue nitride material LEDs are also used to provide red colour converted light LED emission and green colour converted light LED emission. Where QDs are used as the colour conversion material, the thickness of the layers of QD material are typically required to be 20 μm in order to fully absorb input light. This causes a limitation on the size of light emitting pixels and pixel pitch in arrays of light emitting diode based pixels.

Whilst pump source LEDs, such as blue nitride-based material LEDs, are available with high quality, efficient light emission, the application of colour conversion material to achieve light of a desired colour typically results in colour converted LEDs with reduced efficiency in light emission compared with the source LEDs that are used to pump the colour conversion material. Such reduced efficiency is due to, for example, absorption in the colour conversion material of light generated by the source LEDs. Further, colour conversion using known methods such as quantum dot and phosphor material typically results in light emission with a wide full width half maximum (FWHM) spectrum for the peak primary wavelength of converted light. Additionally, known native nitride light emitting diodes emitting green light or red light (for example, based on indium gallium nitride (InGaN) quantum wells) typically have wide FWHM spectra for the green light and red light that is emitted. Consequently, the colour gamut is reduced.

A further difficulty that may arise is the implementation of LEDs for waveguide type augmented reality (AR) display applications, as the direction of light emission is relatively broad. Therefore, typically, in LED arrays, such as micro LED arrays, where a narrow beam angle might be required, collimators and/or lenses are used for each pixel in order to narrow the beam angle and distribution of light. However, the monolithic integration of collimators and lenses is a complex process and requires a high aspect ratio pixel. Additionally, the use of such structure reduces the light efficiency.

Accordingly, it would be beneficial to enable more efficient light extraction in colour converted LEDs that use colour conversion techniques to provide light emitting pixels that emit light of desired wavelengths whilst providing a narrow beam angle.

SUMMARY OF THE INVENTION

In order to mitigate for at least some of the above-described problems, there is provided:

A colour conversion resonator system, comprising: a partially reflective region configured to transmit light of a first primary peak wavelength and to reflect light of a second primary peak wavelength; a further partially reflective region configured to at least partially reflect light with the second primary peak wavelength; and a colour conversion resonator cavity comprising at least one quantum well, wherein the colour conversion resonator cavity is arranged to: receive input light with the first primary peak wavelength through the partially reflective region; and convert, by the at least one quantum well, at least some of the received input light to provide light of the second primary peak wavelength such that light of the second primary peak wavelength resonates in the cavity and light with the resonant second primary peak wavelength is output through the further partially reflective region, wherein the at least one quantum well is placed to coincide with an antinode of the colour conversion resonator cavity standing wavelength for light of the second primary peak wavelength, thereby enhancing at least one of the intensity, spectral width and directionality of output light with the second primary peak wavelength.

There is also provided method of forming a colour conversion resonator system, the colour conversion resonator system comprising: a partially reflective region configured to transmit light of a first primary peak wavelength and to reflect light of a second primary peak wavelength; a further partially reflective region configured to at least partially reflect light with the second primary peak wavelength; and a colour conversion resonator cavity comprising at least one quantum well, wherein the colour conversion resonator cavity is arranged to: receive input light with the first primary peak wavelength through the partially reflective region; and convert, by the at least one quantum well, at least some of the received input light to provide light of the second primary peak wavelength such that light of the second primary peak wavelength resonates in the cavity and light with the resonant second primary peak wavelength is output through the further partially reflective region, wherein the at least one quantum well is placed to coincide with an antinode of the colour conversion resonator cavity standing wavelength for light of the second primary peak wavelength, thereby enhancing at least one of the intensity, spectral width and directionality of output light with the second primary peak wavelength.

Advantageously, improved light output is provided, enabling narrow beam angles and narrow spectra, for example for use in near eye displays. Beneficially, the colour conversion resonator system enables high colour gamut displays and the formation of high resolution micro LED arrays. Advantageously, the optical colour conversion resonator system enables wafer level processing and narrow beam angle emission without collimators, and compressed light emission spectra with reduced efficiency loss.

Preferably the partially reflective region and the further partially reflective region are separated by a distance of (N+1) multiplied by $\lambda_{converted}/2n(\lambda_{converted})$, wherein N is a positive integer number, $\lambda_{converted}$ is the second primary peak wavelength and $n(\lambda_{converted})$ is the effective refractive index of the material separating the partially reflective region and the further partially reflective region, thereby to define the length of the colour conversion resonator cavity. Advantageously, careful tuning of the colour conversion resonator cavity enables enhanced output emission.

Preferably the colour conversion resonator cavity comprises at least one absorption layer configured to absorb input light with the first primary peak wavelength thereby to enable transfer of energy from the input light of the first primary peak wavelength into the at least one quantum well, preferably wherein the absorption layer comprises a material with a lower energy bandgap than the energy of the input light of the first primary peak wavelength. Advantageously, absorption layers aid the process of enabling carriers to recombine in quantum well layers and thus enabling improved resonance of the converted light emitted by the at least one quantum well.

Preferably, the system comprises at least one diffusion barrier arranged to reduce diffusion of carriers from the colour conversion resonator cavity. Advantageously, the use of diffusion barriers reduces diffusion of carriers and hence enhances emissive recombination in the colour conversion resonator cavity.

Preferably wherein the colour conversion resonator cavity comprises a plurality of quantum well, preferably wherein the plurality of quantum wells form part of multiple quantum well structure placed to coincide with an antinode of the colour conversion resonator cavity standing wavelength for light of the second primary peak wavelength and/or wherein the separation of the at least one quantum well layer and a further quantum well layer is N multiplied by $\lambda_{converted}/2n$ $(\lambda_{converted})$, wherein N is a positive integer number, $\lambda_{converted}$ is the second primary peak wavelength and $n(\lambda_{converted})$ is the effective refractive index of the material between the at least one quantum well and the further quantum well at the second primary peak wavelength. Advantageously, careful tuning of the colour conversion resonator cavity enables enhanced output emission.

Preferably the colour conversion resonator system comprises an input pump LED, preferably wherein the input pump LED is a micro LED, more preferably wherein the input pump LED is bonded directly to the colour conversion resonator system, yet more preferably wherein the input pump LED is bonded to the partially reflective region. Advantageously, the combination of LED structures with colour conversion resonator cavities provides for improved coupling and improved light emission. Beneficially, LED structures (such as blue light emitting nitride based LEDs) are used as the input source of light for light emitting pixels of different colours, thereby providing enhanced light emission that is implementable in arrays of light emitting pixels.

Preferably the colour conversion resonator system is bonded onto the input pump LED using dielectric bonding or polymer bonding. Advantageously, such bonding enables high quality coupling between colour conversion resonator cavity systems and input pump LEDs, thereby reducing losses and enhancing the efficiency of the resultant devices.

Preferably at least one of the partially reflective region and the further partially reflective region comprises a distributed Bragg reflector, preferably wherein the distributed Bragg reflector is at least one of: a double band distributed Bragg reflector, a conventional distributed Bragg reflector and a vertical stack of two distributed Bragg reflectors, more preferably wherein the partially reflective region comprises a blue wavelength centred low Herpin index DBR or a green wavelength centred low Herpin index DBR or a red wavelength centred low Herpin index DBR. Advantageously, the partially reflective regions are turned in order to optimise which wavelengths are emitted by light emitting pixels formed by the combination of colour conversion resonator cavity systems and LED devices. Beneficially, light of predefined wavelengths is recycled in the colour conversion resonator cavities in order to enhance the conversion efficiency of input light with a primary peak wavelength to output light with a different primary peak wavelength.

Preferably the input light is at least one of UV light and visible light, preferably wherein the input light has a wavelength of between 340 nm and 560 nm. Advantageously, high quality, established input LED sources with shorter wavelengths than the wavelength of further visible light colours required for optical displays are used to provide an input pump source for the colour conversion in the colour conversion resonator cavity.

Preferably at least one of the partially reflective region and the colour conversion resonator cavity comprises a III-V semiconductor material and/or a dielectric material. Advantageously, the partially reflective region is formed using techniques that enable seamless integration of the functional layers in the colour conversion resonator cavity.

Preferably the partially reflective layer has a reflectivity less than 20% of light of the first primary peak wavelength and a reflectivity of greater than 80% of the second primary peak wavelength, or wherein the partially reflective layer has a reflectivity less than 10% of light of the first primary peak wavelength and a reflectivity of greater than 90% of the second primary peak wavelength, or wherein the partially reflective layer has a reflectivity less than 5% of light of the first primary peak wavelength and a reflectivity of greater than 95% of the second primary peak wavelength. Advantageously, the partially reflective regions are tuned in order to provide improved output qualities in different situations There is also provided an array of pixels comprising the colour conversion resonator system. Advantageously, light emitting pixels based on the combination of light emitting devices, such as LED devices, and colour conversion resonator cavities means that high purity colour light emitting pixels can be formed on a scale that means that they can be implemented in high resolution micro scale arrays.

Preferably a first pixel is configured to emit light of a different wavelength to a second pixel, preferably wherein the array comprises a third pixel configured to emit light of a different wavelength to the first pixel and the second pixel. Advantageously, multi-colour arrays of light emitting pixels are formed using colour conversion resonator cavities.

Preferably the method comprises one or more of the following steps: growing a colour conversion resonator cavity on a substrate, preferably wherein the substrate comprises a buffer structure; depositing or growing the partially reflective region and/or the further partially reflective region on the substrate; depositing bonding material; bonding the colour conversion resonator system to an LED structure; removing the substrate and/or buffer structure by etching isolating the colour conversion resonator cavity to form one or more pixels.

Advantageously, forming a colour conversion resonator cavity on a substrate enables large scale formation of colour conversion resonator cavities for integration with light emitting devices. Beneficially, known growth and processing techniques are applied to form structures with high quality, low defect density, material that provides for efficient light input and light conversion for use in light emitting pixels.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which.

The advantageous and elegant implementation of a high colour purity, narrow beam angle, light emitting colour conversion resonator system, formed in combination with a light emitting device, such as a light emitting diode (LED) device, is described with reference to FIGS. 1 to 4. The Figures illustrate how a colour conversion resonator system is formed and how it interacts with a light emitting device using cross-sectional views of individual structures based on single light emitting devices. However, alternatively or additionally, the concept is applicable to two dimensional arrays of light emitting devices, such as high resolution micro LED arrays, including high resolution monolithic micro LED arrays with light emitting surfaces of pixel pitch less than or equal to 10 μm and preferably less than or equal to 5 μm.

As noted above, in display applications of micro LEDs, narrow beam angle and narrow spectrum are desirable for waveguide type AR display applications and high colour gamut displays, respectively. However, current micro LED devices using colour conversion materials, such as phosphors or Quantum Dots, and native group III-N materials, may incur difficulties in achieving such a high colour gamut and narrow spectra, and are limited in the size that is achievable by the required thickness of quantum dots, when these are used. Usually, to reduce the beam angle, collimators or lens structures are used, but these may be difficult and bulky to realize on every pixel. Furthermore, to narrow down the emission spectrum, filters are typically inserted to cut wavelength, but this reduces the efficiency of pixels. Advantageously, the colour conversion resonator described here enables wafer level processing and narrow beam angles without collimators and a compressed spectrum with an improvement in the reduction of efficiency loss.

Figure 1:
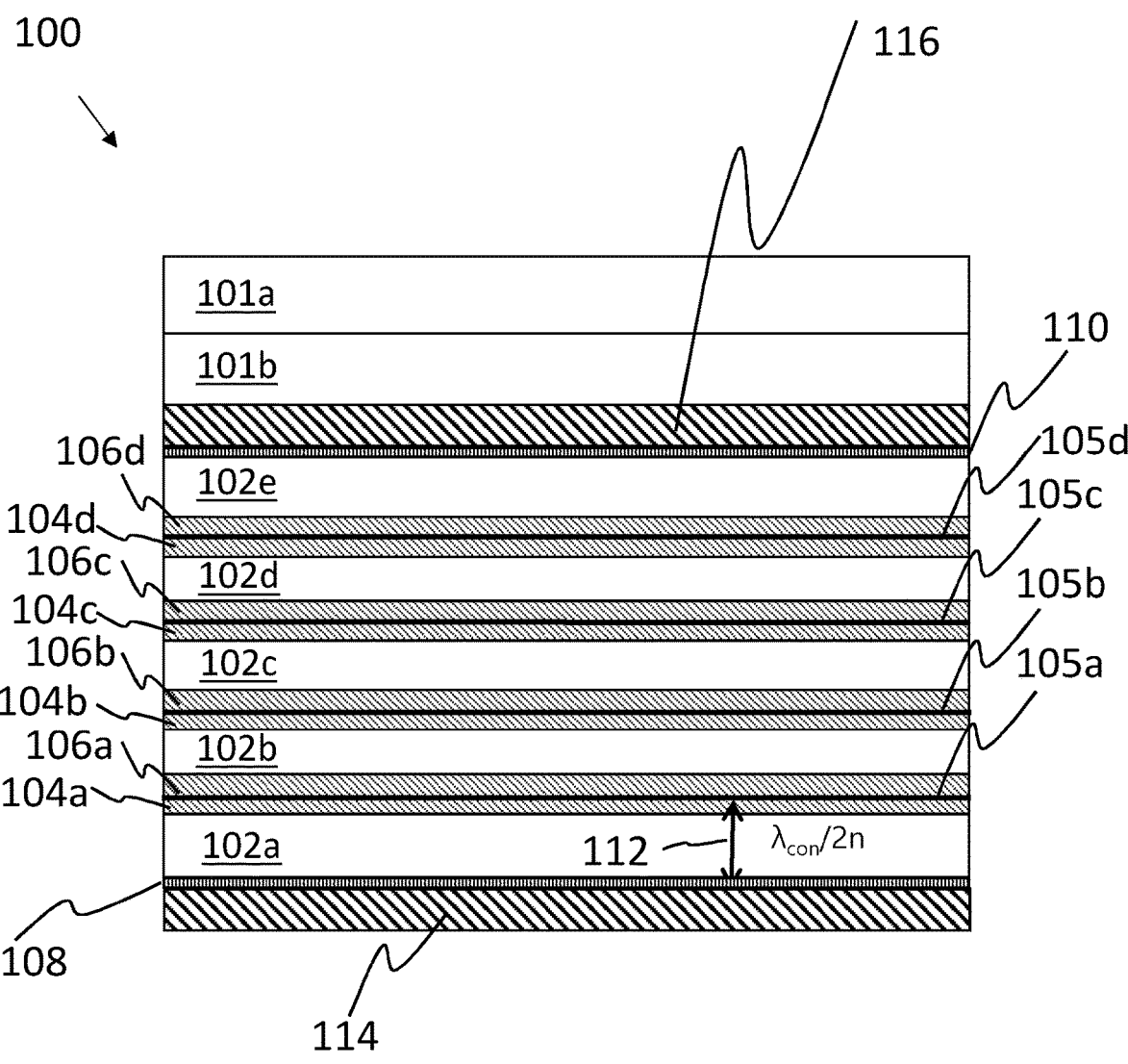
FIG. 1 shows a cross-sectional view of a colour conversion resonator cavity with reflectors.

In FIG. 1 there is shown a cross sectional view of a colour conversion resonator cavity system 100. The colour conversion resonator cavity system 100 is a stack of epitaxial crystalline compound semiconductor layers. The epitaxial crystalline compound semiconductor layers are provided by sequential growth of the epitaxial layers on a growth substrate 101a. The growth substrate 101a, for example a silicon, silicon carbide, sapphire, gallium nitride, or other suitable growth substrate is used as a base for the subsequent growth of epitaxial crystalline compound semiconductor layers. A buffer layer 101b is grown on the substrate 101a. The buffer layer 101b comprises gallium nitride (GaN). In further examples, additional and/or alternative buffer layers 101b are included in the growth process. The growth substrate 101a and the buffer layer 101b are removed when the eventual colour conversion resonator cavity system 100 has been grown and bonded to its light input source, as described herein. In further examples, the substrate 101a and buffer layer 101b are removed after the epitaxial compound semiconductor crystalline layers have been formed. Beneficially, the growth of such epitaxial compound semiconductor crystalline layers formed in this manner can be controlled with high precision to provide high quality material with low defect densities, well controlled thicknesses of layers and efficient emissive recombination of carriers at controlled wavelengths of light.

The colour conversion resonator cavity system 100 is designed to receive input light from an input light source and to convert input light with a primary peak wavelength from an input light source to provide output light with a different, converted, primary peak wavelength of light. The colour conversion resonator cavity system 100 is designed such that light of the converted primary peak wavelength resonates in the cavity and resonant converted light is output from the colour conversion resonator cavity system 100.

FIG. 1 shows a colour conversion resonator cavity system 100 in the orientation that is subsequently bonded to an input LED. Therefore, the growth sequence of layers is effectively from substrate 101a shown at the top of FIG. 1 to a partially reflective region 114 shown at the bottom of FIG. 1.

Colour conversion resonator cavity system 100 is shown in a particular orientation and the skilled person understands that the sequence of growth of the layers on the substrate 101a is such that a partially reflective region 116 is grown on the buffer layer 101b prior to the sequential growth of a barrier layer 110 of a first type (described below), a barrier layer 102e of a second type (described below), an absorption layer 106d, a quantum well layer 105d, an absorption layer 104d, a barrier layer 102d of the second type, an absorption layer 106c, a quantum well layer 105c, an absorption layer 104c, a barrier layer 102c of the second type, an absorption layer 106b, a quantum well layer 105b, an absorption layer 104b, a barrier layer 102b of the second type, an absorption layer 106a, a quantum well layer 105a, an absorption layer 104a, a barrier layer 102a of the second type, a barrier layer 108 of the first type and a partially reflective region 114.

Advantageously, the substrate 101a is used to locate the colour conversion resonator cavity system 100 with respect to an input light device in order to bond the colour conversion resonator cavity system 100 to the input light device and is then removed. In further examples, the epitaxial layers of the colour conversion cavity system 100 are provided in a different sequential order.

Accordingly, in FIG. 1 illustrates a colour conversion resonator cavity system formed on a substrate 101a and inverted to show a partially reflective region that is the first partially reflective region 114 that is a reflector of the colour conversion resonator cavity system 100. Upon the first partially reflective region 114 there is shown a first type of barrier layer 108. Upon the barrier layer 108 of the first type there is shown a second type barrier layer 102a, upon which is shown an absorption layer 104a. The first type of barrier layer has a higher bandgap than the absorption layer 104a. The second type barrier layer 102a has a bandgap that is higher than or equal to the bandgap of the absorption layer 104a and that is lower than the bandgap of the first type of barrier layer 108. On the absorption layer 104a there is shown a quantum well layer 105a. On the quantum well layer 105a there is shown a further absorption layer 106a. The sequence is repeated with a further barrier layer 102b of the second type shown on the absorption layer 106a, followed by an absorption layer 104b shown on the barrier layer 102b of the second type, then a quantum well layer 105b, and a further absorption layer 106b. The sequence is then repeated with a further barrier layer 102c of the second type shown on the absorption layer 106b, another absorption layer 104c shown on the barrier layer 102c of the second type, another quantum well layer 105c grown on the absorption layer 104c, another absorption layer 106c shown on the quantum well layer 105c, another barrier layer 102d of the second type shown on the absorption layer 106c, another absorption layer 104d shown on the barrier layer 102d of the second type, another quantum well layer 105d shown on the absorption layer 104d and another absorption layer 106d shown on the quantum well layer 105d. There is a further barrier layer 102e of the second type shown on the absorption layer 106d. On the top of the structure, a further barrier layer 110 of the first type is shown. A further partially reflective region 116 is shown upon the barrier layer 110 of the first type. The further partially reflective region 116 is a reflector that forms part of the colour conversion resonator cavity system 100.

The first type of barrier layers 108, 110 are diffusion barriers designed to prevent carriers generated in the colour conversion resonator cavity system 100 from diffusing out of the colour conversion resonator cavity system 100. The first type of barrier layers 108, 110 are of the order of 1 to 100 nm in thickness. In an example, the first type of barrier layers 108, 110 are AlGaN barriers. In further examples, the first type of barrier layers 108, 110 are formed from different material, or excluded.

The skilled person understands that the epitaxial layers forming the colour conversion resonator cavity system 100 are planar layers grown on a substrate 101a. Once the colour conversion resonator cavity system 100 has been formed, the substrate 101a is used to locate the colour conversion resonator cavity system 100 with respect to its light input and then the substrate 101a (along with any buffer layers 101b) is removed, providing a free standing colour conversion resonator cavity system 100. In further examples, the substrate 101a is removed at an earlier stage in the process, prior to the colour conversion resonator cavity system 100 being fixed to an input LED. The colour conversion resonator cavity system 100 is described as being grown in a particular sequence of steps with relation to the substrate 101a. The skilled person understands that in further examples, alternatively or additionally, the colour conversion resonator cavity system 100 is provided in the reverse order prior to removal of a substrate 101a and/or the buffer layer 101b. Further, the colour conversion resonator cavity system 100 is shown to comprise particular layers. In further examples, alternative or additional layers are used to form the colour conversion resonator cavity system 100. For example, in further examples, the colour conversion resonator cavity system comprises further quantum well layers and/or absorption layers and intervening layers, or fewer quantum well layers and/or absorption layers and intervening layers. In further examples, layers are omitted whilst preserving the concepts described herein.

The colour conversion resonator cavity 100 system of FIG. 1 is formed using epitaxial compound semiconductor growth techniques such as metalorganic chemical vapour deposition (MOCVD) and molecular beam epitaxy (MBE). Additionally, or alternatively, the colour conversion resonator cavity system 100 is formed using any appropriate technique.

The colour conversion resonator cavity system 100 described with respect to FIG. 1 is formed from nitride-based materials. In particular, the epitaxial crystalline compound semiconductor layers are Gallium Nitride (GaN) based materials. Whilst the structures described in relation to FIG. 1 relate to nitride-based semiconductor compound materials, the skilled person understands that the concepts described herein are applicable to other materials, in particular to other semiconductor materials, for example other III-V compound semiconductor materials, or II-VI compound semiconductor materials.

The quantum well layers 105a, 105b, 105c, 105d are designed to enable carriers to recombine such that emissive recombination results in an output of light with a primary peak wavelength that is different to the wavelength of input light that result in the emission of output light. In order to enable emission of output light, input light is absorbed by the absorption layers 104a, 104b, 104c, 104d, 106a, 106b, 106c and 106d. In an example, the input light is blue light with a wavelength of approximately 450 nm. The wavelength of light output by the quantum well layers 105a, 105b, 105c, 105d is longer than the wavelength input. The output wavelength of light is the converted wavelength of light. Whilst the input light is blue light, in further examples, additional or alternative wavelengths of input light are used.

The colour conversion resonator cavity system 100 shows four quantum well layers 105a, 105b, 105c, 105d. Each of the quantum well layers 105a, 105b, 105c, 105d, is associated with absorption layers. Each of the quantum well layers 105a, 105b, 105c, 105d, includes at least one quantum well. A first quantum well layer 105a is associated with two absorption layers 104a, 106a. A second quantum well layer 105b is associated with two absorption layers 104b, 106b. A third quantum well layer 105c is associated with two absorption layers 104c, 106c. A fourth quantum well layer 105d is associated with two absorption layers 104d, 106d. Accordingly, the colour conversion resonator cavity system 100 comprises a plurality of quantum wells. In further examples, additional or alternative quantum well structures are implemented in the colour conversion resonator cavity system 100. For example, one or more of the quantum well layers 105a, 105b, 105c, 105d, includes a plurality of quantum wells, such that one or more of the quantum well layers 105a, 105b, 105c, 105d includes multiple quantum wells (MQWs).

Careful positioning of the quantum well structures (single and/or multiple QWs) provides an improved output of light. The quantum well layers 105a, 105b, 105c, 105d are placed to coincide with the antinodes of the colour conversion resonator cavity standing wavelength for light of the second primary peak wavelength (namely the converted light), thereby enhancing at least one of the intensity, spectral width and directionality of output light with the second primary peak wavelength. The separation of the first partially reflective region 114 and the first quantum well layer 105a is shown as being separated by a separation 112 between lateral planes of $\lambda_{converted}/2n(\lambda_{converted})$, where $\lambda_{converted}$ is the primary peak wavelength of converted light in the colour conversion resonator cavity system 100 and $n(\lambda_{converted})$ is the effective refractive index of the material separating the partially reflective region and the first quantum well layer 105a. The further quantum well layers 105b, 105c, 105d are spaced at the same separation 112 relative to each other, where the separation 112 indicates a distance perpendicular to the lateral planes formed by the epitaxial layers in the colour conversion resonator system 100. The positioning of the quantum well layers 105a, 105b, 105c, 105d is such that they coincide with the antinodes of the resonant standing wave of the primary peak wavelength of converted light in the colour conversion resonator cavity system to improve at least one of the intensity, spectral width and directionality of output light with the second primary peak wavelength, as described herein. In the case where the quantum well layers 105a, 105b, 105c, 105d each comprise multiple quantum wells (MQWs), the MQWs are positioned to coincide with the antinodes of the resonant standing wave of the primary peak wavelength of converted light in the colour conversion resonator cavity system to improve at least one of the intensity, spectral width and directionality of output light with the second primary peak wavelength.

In order to enable efficient resonance in the colour conversion resonator cavity system 100, the colour conversion resonator cavity system 100 is formed between two reflector layers: a first partially reflective region 114 and a second, further, partially reflective region 116. The first reflective region 114 and the second reflective region 116 are layers that are configured selectively to reflect and transmit light such that they are at least partially reflective.

Advantageously, the first and second reflective regions 114, 116 are formed during the same process that provides the colour conversion resonator cavity system 100. Beneficially, a continuous growth process is used to form the colour conversion resonator cavity system 100, which results in high quality, low defect density, material being provided, with close control of the thicknesses of the layers and hence of the separation of lateral planes forming the epitaxial structure. In further examples, alternatively or additionally, the partially reflective regions 114, 116 are separately deposited in a physical vapour deposition (PVD) reactor, or an evaporator.

The colour conversion resonator cavity system 100 is designed to receive input light through the first partially reflective region 114. The input light has a primary peak wavelength. The input light is absorbed in the colour conversion resonator cavity system 100 by the absorption layers 104a, 106a, 104b, 106b, 104c, 106c, 104d, 106d and the quantum well layers 105a, 105b, 105c, 105d. Absorption of the input light results in the generation of electron hole pairs in the absorption layers 104a, 106a, 104b, 106b, 104c, 106c, 104d, 106d and the quantum well layers 105a, 105b, 105c, 105d. The electron hole pairs generated in the absorption layers 104a, 106a, 104b, 106b, 104c, 106c, 104d, 106d move to the quantum well layers 105a, 105b, 105c, 105d. The electron hole pairs recombine and emit light with a wavelength determined by the composition of the quantum well layers 105a, 105b, 105c, 105d. The light that is emitted by the quantum well layers 105a, 105b, 105c, 105d has a longer primary peak wavelength than the primary peak wavelength of the input light that is absorbed in the colour conversion resonator cavity system 100. The primary peak wavelength of light that the input light is converted to is determined by the transition wavelength. Where the input light is blue light, quantum well layers 105a, 105b, 105c, 105d designed to emit green light have a spectral range (full width half maximum (FWHM)) of approximately 30 nm when the quantum well materials are $Al_xIn_yGa_{1-x-y}N$. Where the quantum well layers 105a, 105b, 105c, 105d are designed to emit red light, the spectral range is approximately 50 nm. In general, where the quantum well layers 105a, 105b, 105c, 105d are formed from $Al_xIn_yGa_{1-x-y}N$ or $Al_xIn_yGa_{1-x-y}P$, light from emissive recombination is emitted in all directions, however, light that meets the cavity condition for the colour conversion resonator cavity system 100 is enhanced and has a concentrated emission spectrum and narrow beam angle.

The absorption layers 104a, 106a, 104b, 106b, 104c, 106c, 104d, 106d are formed from aluminium indium gallium nitride ($Al_aIn_bGa_{1-a-b}N$) or aluminium indium gallium phosphide ($Al_aIn_bGa_{1-a-b}P$). The absorption layers 104a, 106a, 104b, 106b, 104c, 106c, 104d, 106d have a lower bandgap than the input light and are each formed in a single growth step. In further examples, the absorption layers 104a, 106a, 104b, 106b, 104c, 106c, 104d, 106d are formed in stepped or continuous grading layers, such that the composition of the absorption layers 104a, 106a, 104b, 106b, 104c, 106c, 104d, 106d varies vertically away from the planar quantum well layer with which they are associated. Beneficially, such absorption layers simultaneously absorb light whilst providing suitable material to aid strain relaxation, thereby to enhance the quality of the crystalline structures forming the colour conversion resonator cavity system 100. In further examples, different compositions and configurations of absorption layers are implemented in order to absorb light from an input LED and enable down conversion of the input light to a converted wavelength for output.

The first reflective region 114 and the second reflective region 116 are separated by a length of (N+1) multiplied by $\lambda_{converted}/2n(\lambda_{converted})$, wherein N is a positive integer number, $\lambda_{converted}$ is the second primary peak wavelength and $n(\lambda_{converted})$ is the effective refractive index of the material separating the first reflective region and the second partially reflective region, thereby to define the length of the colour conversion resonator cavity.

Input light that is absorbed in the colour conversion resonator cavity system 100 is converted to a wavelength ($\lambda_{converted}$) and the converted light, $\lambda_{converted}$, resonates in the cavity system 100. Resonant light is then output via the further partially reflective region 116.

The first partially reflective region 114 and the second partially reflection region 116 are configured such that the cavity formed between them is used to convert input light passing through the first partially reflective region 114 to light with a converted primary peak wavelength and resonant light of the converted primary peak wavelength passes through the second partially reflective region 116.

The first partially reflective region 114 and the second partially reflective region 116 are Distributed Bragg Reflectors (DBRs). The first partially reflective region 114 has a relatively high reflectivity for the wavelength of converted light generated in the colour conversion resonator cavity system 100 and a relatively high transmissivity for the wavelength of the input light. In an example, the first partially reflective region 114 has a relatively low reflectivity, e.g., less than 20% of the primary peak wavelength of the input light from a light emitting device bonded to the first partially reflective region 114 and a relatively high reflectivity, e.g., more than 80%, of converted light generated by absorption of the input light and re-emission in the colour conversion resonator cavity system 100. In further examples, different reflectivity values are used for the first partially reflective region 114. In an example, the first partially reflective region 114 has a reflectivity of input light of less than 10% and a reflectivity of converted light of greater than 90%. In a further example, the first partially reflective region 114 has a reflectivity of input light of less than 5% and a reflectivity of converted light of greater than 95%.

The partially reflective regions 114, 116 are formed from alternating epitaxial crystalline layers of different refractive indices. The refractive indices of the layers, and the thicknesses of the layers, are selected in order to provide a reflectivity response as a function of the wavelength of light incident at the partially reflective layer regions 114, 116. Growth of a DBR in this manner enables seamless formation of a high crystalline quality colour conversion resonator cavity system 100.

In an example the DBR forming the first partially reflective region 114 has a low Herpin index DBR.

The second partially reflective region 116 is formed in a manner similar to the first partially reflective region 114.

Whilst the first and second partially reflective regions 114, 116 are DBRs, in further examples, alternative or additional regions are used. In a further example, the second partially reflective region 116 comprises a vertical stack of two different DBRs. In a further example, the second partially reflective region 116 is omitted. In a further example, the first partially reflective region 114 and/or second partially reflective region 116 comprise stacks of two different DBRs. In a further example, the second partially reflective region 116 comprises double band DBR with relatively high reflectivity of both input and converted wavelengths of light. In a further example, the second partially reflective region 116 comprises a DBR with relatively high reflectivity of converted wavelengths of light.

Whilst the partially reflective layers 114, 116 are DBRs formed of nitride-based epitaxial layers, in further examples the partially reflective layers 114, 116 are additionally, or alternatively formed using different methods whilst maintaining the functionality of enabling reflection of some wavelengths of light and transmission of different wavelengths of light. For example, the first partially reflective region 114 and/or the second partially reflective region 116 are/is formed from dielectric stacks. In a further example, the first partially reflective region 114 and/or the second partially reflective region 116 is formed from alternating layers of GaN and porous GaN. The porosity of the epitaxial crystalline GaN layers forming the partially reflective layer 104 is controlled in order to provide the desired reflectivity response as a function of wavelength, since the porosity of the epitaxial crystalline layers is linked to their refractive index. Advantageously, DBRs formed in this manner can be provided using GaN alone.

Figure 2:
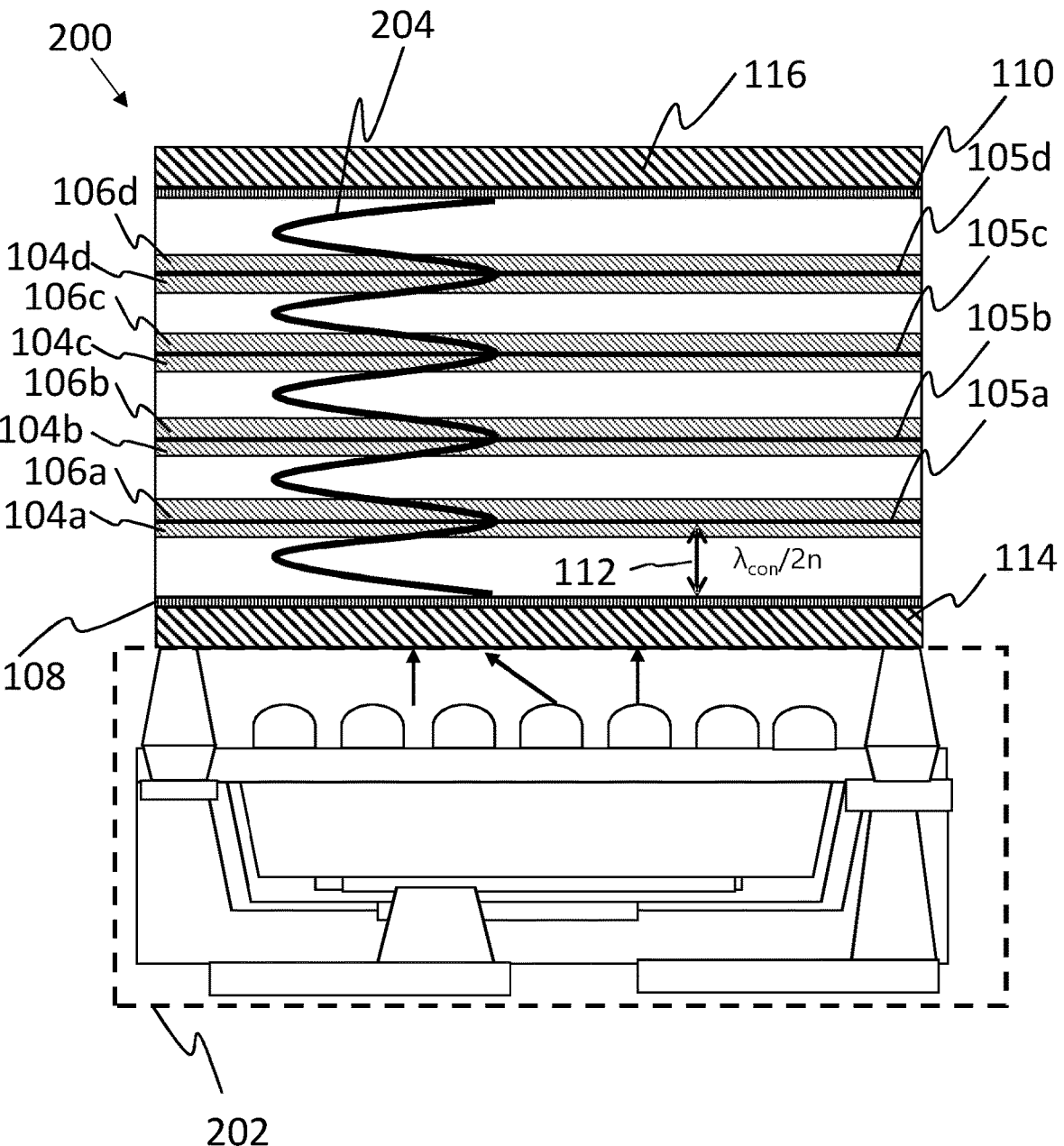
FIG. 2 shows a cross-sectional view of the processed colour conversion resonator cavity of FIG. 1 bonded to a light emitting device.

In order to provide light with improved output properties, the colour conversion resonator cavity system 100 described with reference to FIG. 1 is coupled with an input light emitting device. This arrangement is described in more detail with reference to FIG. 2, which illustrates a resonant standing wave 204 in the colour conversion resonator cavity system 100 bonded to a light emitting device 202. FIG. 2 shows the colour conversion resonator cavity system 100 of FIG. 1 that has been bonded to a light emitting device 202 to provide a system 200, whereby light emitted from the light emitting device 202 is generally directed through a light emitting surface of the light emitting device 202 that is facing the first partially reflective region 114 of the colour conversion resonator cavity system 100, such that input light generated by the light emitting device 202 is received in the colour conversion resonator cavity system for down conversion to a longer wavelength output light that is output through an opposite face of the colour conversion resonator cavity system through the further partially reflective region 116.

The light emitting device 202 is a light emitting diode (LED). In FIG. 2, the light emitting diode 202 is shown as an exemplary system generating light in different directions, as illustrated by the arrows. Whilst the light emitting device 202, in some examples, is formed with separate individual light emitting structures, in an example, the light emitting device 202 is an LED device formed of epitaxial semiconductor crystalline layers. The light in such LED devices is generated by carrier injection in one or more quantum well structures. Light is emitted by the one or more quantum well structures and is extracted through a primary light emitting surface. The primary light emitting surface, which emits light in different directions, is coupled with the colour conversion resonator cavity system 100 in order to provide improved light output.

The light emitting device 202 is bonded to the colour conversion resonator cavity system 100. In an example, the light emitting device 202 is bonded to the colour conversion resonator cavity system 100 using dielectric bonding. The surface of the light emitting device 202 that is to be bonded to the colour conversion resonator cavity system 100 is terminated with a high density oxide film. The surface of the colour conversion resonator cavity system 100 that is to be bonded to the input light emitting device 202 is also terminated with a high density oxide film in order to facilitate wafer level oxide bonding. Accordingly, the primary light emitting surface of the light emitting device 202 placed in close proximity or contact with the first partially reflective region 114 of the colour conversion resonator cavity system 100 such that light that is output from the light emitting device 202 acts as input light for the colour conversion resonator cavity system 100.

In further examples, the light emitting device 202 is bonded to the colour conversion resonator cavity system 100 using polymer bonding, such as polyimide bonding. In further examples, additional or alternative bonding mechanisms are used in order to attach the light emitting device 202 to the colour conversion resonator cavity system 100. Advantageously, the light emitting device 202 is bonded to the colour conversion resonator cavity system 100 to form a single device with minimal interface loss of light emission from the light emitting device 202 at the interface with the colour conversion resonator cavity system 100.

The refractive index of the material used to bond the light emitting device 202 to the colour conversion resonator cavity system is between 1 and 2.5.

Whilst the colour conversion resonator cavity system 100 is shown to be bonded to the input light emitting device 202 at FIG. 2, in an example, the colour conversion resonator cavity system 100 is grown with the first partially reflective region 114 included in the growth step, or not at all. For example, the structure of FIG. 1 is grown on a substrate without the partially reflective regions 114, 116, which are subsequently deposited. A structure comprising the epitaxial layers is etched in order to expose the whole resonator cavity, or part of resonator cavity. The exposed surface is covered with poly or mono crystalline high bandgap material, such as Al(Ga)N. In an example, the growth substrate and any buffer layers implemented in the growth process to facilitate the structure of FIG. 1 are removed by a selective etch process. The first partially reflective region 114 is deposited on a surface that is opposite to the growth substrate surface, prior to bonding the colour conversion resonator cavity system 100 to the input light emitting device 202. The growth substrate and buffer layers removed and a second partially reflective region 116 deposited on the top of the structure to provide the light emission surface of a colour converted LED structure.

Whilst one light emitting device 202 is illustrated at FIG. 2, in further examples, addressable arrays of light emitting devices 202 are bonded to associated colour conversion resonator cavity systems 100 in order to provide arrays of light emitting devices, such as high resolution arrays of light emitting devices. The density of the addressable array is associated to the intended use of the array, where light emitting surfaces of the combined colour conversion resonator cavity system 100 with the light emitting devices 202 provide pixels associated with the light emitting devices. The light emitting devices 202 are processed using wafer or chip level processes.

An exemplary standing wavelength of converted light is shown as a resonant standing wave 204 at FIG. 2. The antinodes of the resonant standing wave 204 of the converted light are shown to coincide with the quantum well layers 105a, 105b, 105c, 105d, such that at least one of the intensity, spectral width and directionality of the converted output light with the second primary peak wavelength is enhanced. The resonant standing wave 204 of the converted light is formed at a resonant cavity condition between the first partially reflective region 114 and the second partially reflective region 116. The barrier layers 108, 110 of the first type are thin layers and are arranged to be provided within the length of the cavity, defined as the distance between the parallel planes formed by the partially reflective regions 114, 116. In further examples, alternative or additional implementations of the layers in the structure are made whilst enhancing the properties of the output light.

Figure 3A:
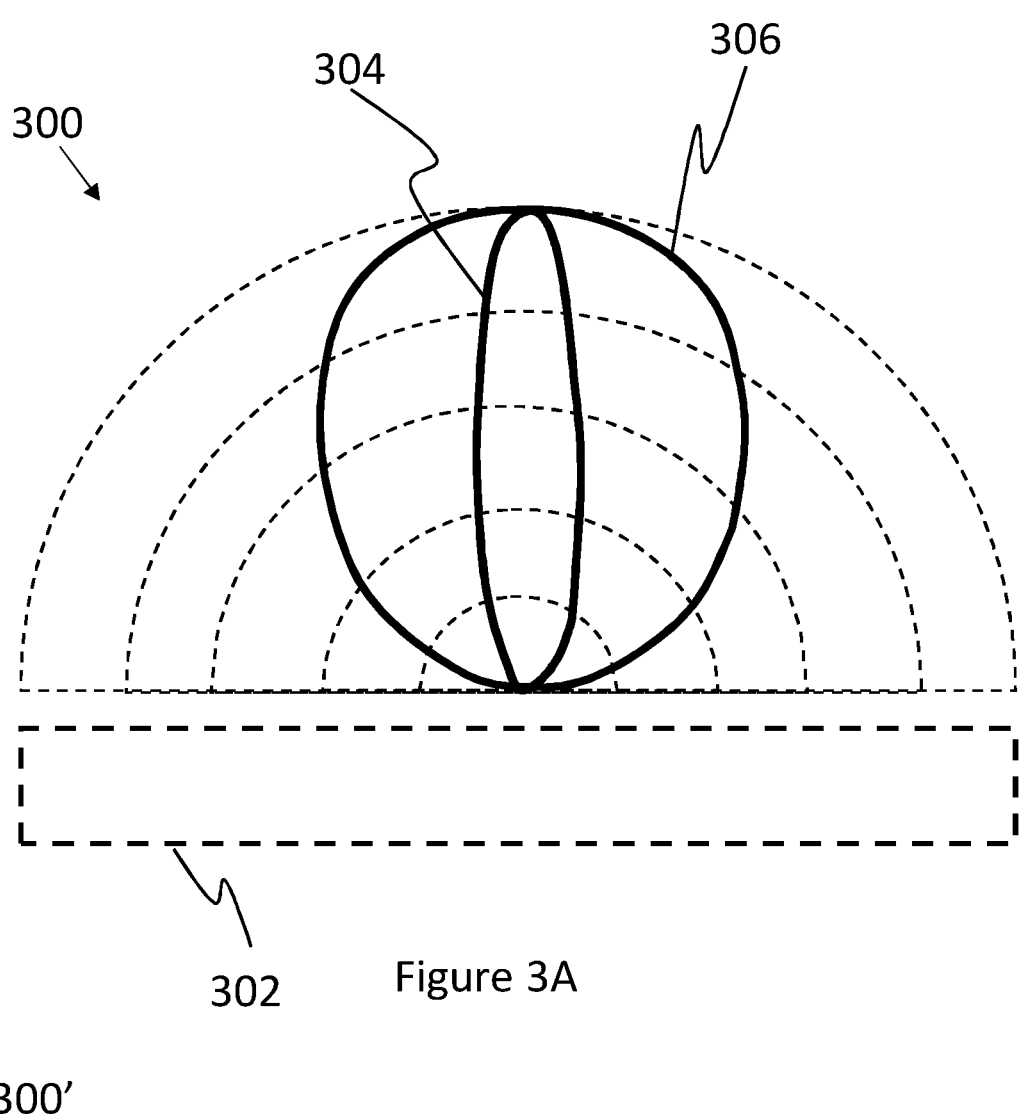
FIG. 3A shows a view of a comparison of angular light distribution from an LED without the colour conversion resonator cavity bonded to a light emitting device of FIG. 2 and with the colour conversion resonator cavity bonded to a light emitting device of FIG. 2.

FIG. 3A shows a view of a comparison of angular light distribution from an LED based light emitting pixel without the colour conversion resonator cavity bonded to a light emitting device of FIG. 2 and with the colour conversion resonator cavity bonded to a light emitting device of FIG. 2.

FIG. 3A shows a view 300 of the angular distribution of light emission 306 from a typical LED. The view 300 is a two-dimensional view and the skilled person understands that the distribution shown in the view 300 is applicable to a three-dimensional output of light. The emission 306 is Lambertian. Such emission 306 is typical emission from a standard LED 302 in the absence of the colour conversion resonator cavity system 100 described with reference to FIGS. 1 and 2. However, when an LED, such as the light emitting device 202, is coupled with the colour conversion resonator cavity system 100, the angular distribution of light emission is altered. Once the input light from an LED with such emission 306 has been absorbed in the MQWs and pump absorbing layers of the colour conversion resonator cavity system 100, electron hole pairs are generated in the MQWs and pump absorbing layers. The electrons and holes generated in the pump absorbing layers move to the MQWs. Therefore, the emitted light wavelength is determined by MQW transitions wavelength. This transition wavelength has a spectral range (FWHM: full width half maximum) of ~30 nm for green and ~50 nm for Red when QW materials are $Al_xIn_yGa_{1-x-y}N$. In general, $Al_xIn_yGa_{1-x-y}N$ or $Al_xIn_yGa_{1-x-y}P$ MQWs emit the light all directions but the colour conversion cavity resonator enhances the emission meeting the cavity condition. The results are narrow beam angle and concentrated emission spectrum as shown by the colour converted resonant emission 304 distribution illustrated at FIG. 3A.

Figure 3B:
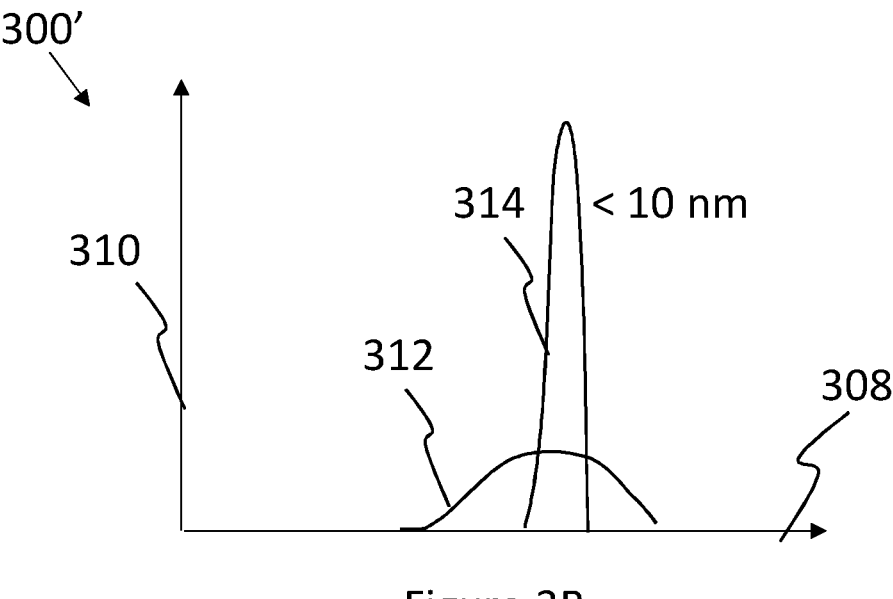
FIG. 3B shows a comparison of emission spectra of an LED without the colour conversion resonator cavity bonded to a light emitting device of FIG. 2 and with the colour conversion resonator cavity bonded to a light emitting device of FIG. 2.

FIG. 3B shows a comparison of light emission spectra 300' from an LED without the colour conversion resonator cavity bonded to a light emitting device of FIG. 2 and with the colour conversion resonator cavity bonded to a light emitting device of FIG. 2. There is shown a graph of light emission intensity on the vertical axis 310 versus wavelength on the horizontal axis 308.

FIG. 3B shows how light emission spectra compares converted emission 312 from an LED with colour conversion but in the absence of the resonator cavity bonded to the LED, with emission 314 from the LED with the colour conversion resonator cavity bonded to the LED. The result is that the intensity of the emission 314 with the colour conversion resonator cavity is greater than emission 312 without the resonator cavity and the emission 314 with the colour conversion resonator cavity has a narrower spectral width than the emission without the resonator cavity. The result is that the colour conversion resonator cavity system provides more intense, higher purity colour light emission.

The improved angular distribution, intensity and colour purity illustrated with respect to FIGS. 3A and 3B provides significant benefits, particularly in respect of augmented reality applications that use high resolution arrays of LEDs to form displays in close proximity to users. Further, beneficially, the use of epitaxially grown layers to form colour conversion resonator cavity systems means that the size constraints imparted by quantum-dot based colour conversion systems are overcome and smaller light emitting surfaces of light emitting pixels based on micro LEDs can be provided, and arrays of light emitting pixels with reduced pixel pitch can be provided.

Figure 4:
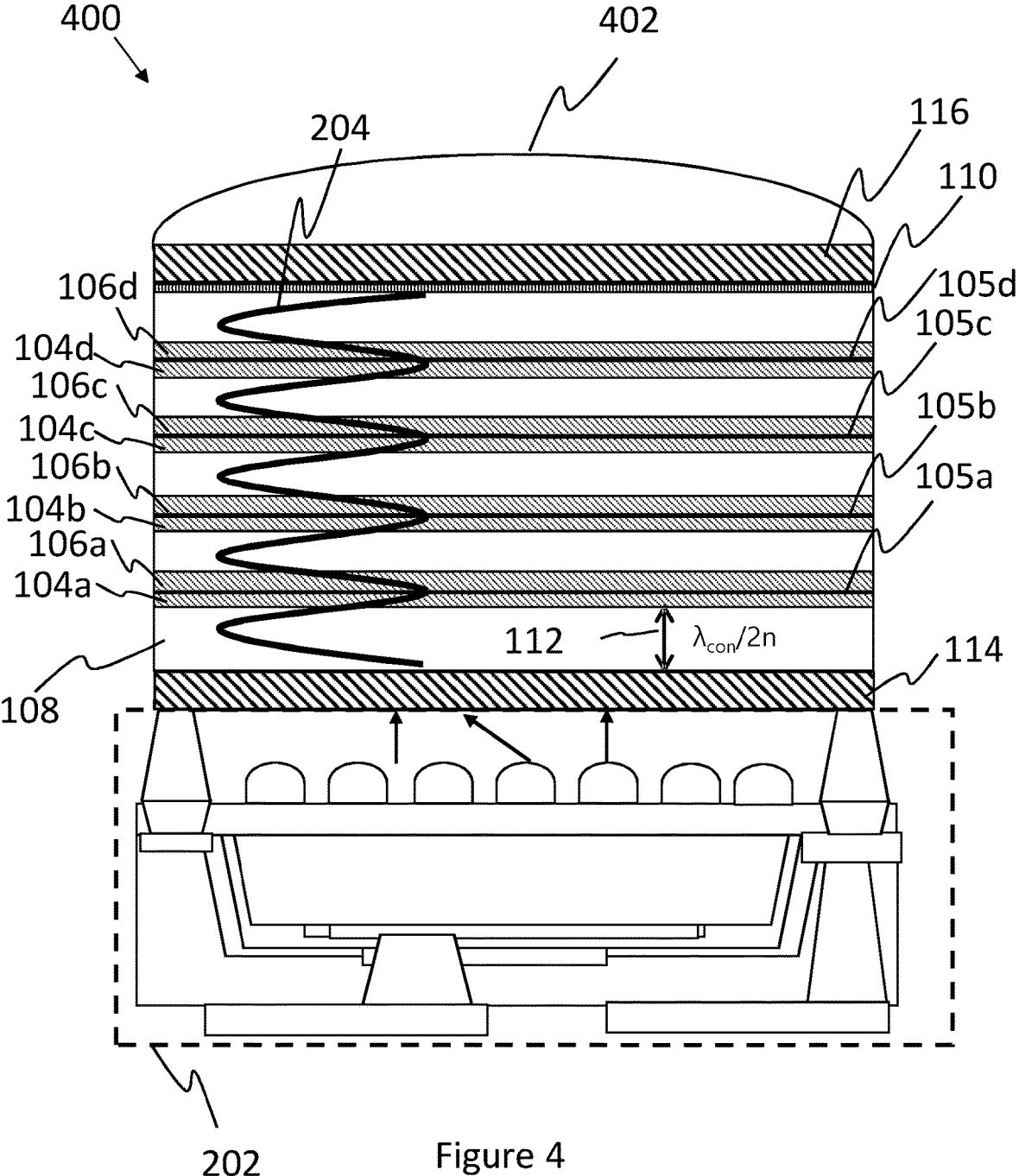
FIG. 4 shows a cross sectional view of a processed colour conversion resonator cavity bonded to a light emitting device with an additional lens.

FIG. 4 illustrates how, in an example, a light emitting pixel 400 based on a light emitting device 202 is formed with a lens 402. The implementation of a lens 402 enables broader light emission angles along with higher intensity and colour purity, providing improved light emission for applications such as high resolution displays, e.g., high resolution LED pixel televisions.

The colour conversion resonator cavity system 100 in combination with input light emitting devices, such as LED devices is implemented as described above. In further examples, the inventive concept is implemented using structures formed with different compositions, using different sequences of steps Whilst the light emitting device 202 is shown as a discrete input LED, in further examples, the light emitting device 202 is an LED device formed in an array of LED devices. Such LED devices are provided by conventional means and is formed in a manner that enables its combination with colour conversion resonator cavities. Whilst the process is described with reference to LED light sources, in further examples, alternative or additional light sources are implemented.

In an example, where the input light sources form part of an array, such as a high resolution micro LED array, pixels are formed by the combination of individual LEDs with their associated colour conversion resonator cavity. Pixels in an array of pixels are isolated from one another in order to prevent carrier diffusion between neighbouring pixels. Further, surface treatment to prevent carrier diffusion out to surface defects is implemented in an example.

Whilst a method for forming a colour conversion resonator cavity system, the skilled person is described above with reference to FIGS. 1 to 4, the skilled person understands that in further examples, additional or alternative steps are used and in yet further examples, some steps are omitted. In further examples, the order of processing steps is altered whilst providing one or more LED structures in combination with one or more colour conversion resonator cavities to provide improved light emission properties at least as described herein.

What is claimed is:

1. A near-eye display comprising an array of pixels with a pixel pitch less than or equal to 10 μm, the array comprising at least one color conversion resonator system, comprising:

a partially reflective region configured to transmit light of a first primary peak wavelength and to reflect light of a second primary peak wavelength;

a further partially reflective region configured to at least partially reflect light with the second primary peak wavelength, wherein the partially reflective region and the further partially reflective region are formed from alternating layers of GaN and porous GaN;

an input pump micro LED bonded directly to the color conversion resonator system; and a color conversion resonator cavity comprising at least one quantum well, wherein the color conversion resonator cavity is arranged to:

receive input light with the first primary peak wavelength through the partially reflective region; and convert, by the at least one quantum well, at least some of the received input light to provide light of the second primary peak wavelength such that light of the second primary peak wavelength resonates in the cavity and light with the resonant second primary peak wavelength is output through the further partially reflective region, wherein the at least one quantum well is placed to coincide with an antinode of the color conversion resonator cavity standing wavelength for light of the second primary peak wavelength, thereby enhancing at least one of the intensity, spectral width and directionality of output light with the second primary peak wavelength.

2. The near-eye display according to claim 1, wherein the partially reflective region and the further partially reflective region are separated by a distance of (N+1) multiplied by λconverted/2n(λconverted), wherein N is a positive integer number, λconverted is the second primary peak wavelength and n(λconverted) is the effective refractive index of the material separating the partially reflective region and the further partially reflective region, thereby to define the length of the color conversion resonator cavity.

3. The near-eye display according to claim 1, wherein the color conversion resonator cavity comprises at least one absorption layer configured to absorb input light with the first primary peak wavelength thereby to enable transfer of energy from the input light of the first primary peak wavelength into the at least one quantum well layer.

4. The near-eye display according to claim 1, comprising at least one diffusion barrier arranged to reduce diffusion of carriers from the color conversion resonator cavity.

5. The near-eye display according to claim 1, wherein the color conversion resonator cavity comprises a plurality of quantum wells, and the plurality of quantum wells form part of multiple quantum well structure placed to coincide with an antinode of the color conversion resonator cavity standing wavelength for light of the second primary peak wavelength and/or wherein the separation of the at least one quantum well and a further quantum well is N multiplied by λconverted/2n(λconverted), wherein N is a positive integer number, λconverted is the second primary peak wavelength and n(λconverted) is the effective refractive index of the material between the at least quantum well and the further quantum well at the second primary peak wavelength.

6. The near-eye display according to claim 1, wherein the input pump micro LED is bonded to the partially reflective region.

7. The near-eye display according to claim 1, wherein the color conversion resonator system is bonded onto the input pump micro LED using polymer bonding.

8. The near-eye display according to claim 1, wherein at least one of the partially reflective region and the further partially reflective region comprises a distributed Bragg reflector, wherein the distributed Bragg reflector is at least one of: a double band distributed Bragg reflector, a conventional distributed Bragg reflector and a vertical stack of two distributed Bragg reflectors.

9. The near-eye display according to claim 1, wherein the input light has a wavelength of between 340 nm and 560 nm.

10. The near-eye display according to claim 1, wherein at least one of: the partially reflective layer has a reflectivity less than 20% of light of the first primary peak wavelength and a reflectivity of greater than 80% of the second primary peak wavelength; and the partially reflective layer has a reflectivity less than 10% of light of the first primary peak wavelength and a reflectivity of greater than 90% of the second primary peak wavelength; and the partially reflective layer has a reflectivity less than 5% of light of the first primary peak wavelength and a reflectivity of greater than 95% of the second primary peak wavelength.

11. The near-eye display according to claim 1, wherein a first pixel is configured to emit light of a different wavelength to a second pixel.

12. A method of forming a near-eye display comprising an array of pixels with a pixel pitch less than or equal to 10 μm, comprising a color conversion resonator system, the color conversion resonator system comprising:

a partially reflective region configured to transmit light of a first primary peak wavelength and to reflect light of a second primary peak wavelength;

a further partially reflective region configured to at least partially reflect light with the second primary peak wavelength;

an input pump micro LED bonded directly to the color conversion resonator system; and a color conversion resonator cavity comprising at least one quantum well, wherein the color conversion resonator cavity is arranged to:

receive input light with the first primary peak wavelength through the partially reflective region; and convert, by the at least one quantum well, at least some of the received input light to provide light of the second primary peak wavelength such that light of the second primary peak wavelength resonates in the cavity and light with the resonant second primary peak wavelength is output through the further partially reflective region, wherein the at least one quantum well is placed to coincide with an antinode of the color conversion resonator cavity standing wavelength for light of the second primary peak wavelength, thereby enhancing at least one of the intensity, spectral width and directionality of output light with the second primary peak wavelength.

13. The method according to claim 12, wherein the partially reflective region and the further partially reflective region are separate by a distance of (N+1) multiplied by λconverted/2n(λconverted), wherein N is a positive integer number, $\lambda$converted is the second primary peak wavelength and n($\lambda$converted) is the effective refractive index of the material separating the partially reflective region and the further partially reflective region, thereby to define the length of the color conversion resonator cavity.

14. The method according to claim 12, wherein the color conversion resonator cavity comprises at least one absorption layer configured to absorb input light with the first primary peak wavelength thereby to enable transfer of energy from the input light of the first primary peak wavelength into the at least one quantum well layer.

15. The method according to claim 12, comprising at least one diffusion barrier arranged to reduce diffusion of carriers from the color conversion resonator cavity.

16. The method according to claim 12, wherein the color conversion resonator cavity comprises a plurality of quantum wells, wherein the plurality of quantum wells form part of multiple quantum well structure placed to coincide with an antinode of the color conversion resonator cavity standing wavelength for light of the second primary peak wavelength and/or wherein the separation of the at least one quantum well layer and a further quantum well layer is N multiplied by $\lambda$converted/2n($\lambda$converted), wherein N is a positive integer number, $\lambda$converted is the second primary peak wavelength and n($\lambda$converted) is the effective refractive index of the material between the at least one quantum well and the further quantum well at the second primary peak wavelength.

17. The method according to claim 12, wherein the color conversion resonator system is directly bonded onto the input pump micro LED using polymer bonding.

18. The method according to claim 12, wherein at least one of the partially reflective region and the further partially reflective region comprises a distributed Bragg reflector, wherein the distributed Bragg reflector is at least one of: a double band distributed Bragg reflector, a conventional distributed Bragg reflector and a vertical stack of two distributed Bragg reflectors.

19. The method according to claim 12, wherein the input light has a wavelength of between 340 nm and 560 nm.

20. The method according to claim 12, wherein at least one of:

the partially reflective layer has a reflectivity less than 20% of light of the first primary peak wavelength and a reflectivity of greater than 80% of the second primary peak wavelength; and the partially reflective layer has a reflectivity less than 10% of light of the first primary peak wavelength and a reflectivity of greater than 90% of the second primary peak wavelength; and the partially reflective layer has a reflectivity less than 5% of light of the first primary peak wavelength and a reflectivity of greater than 95% of the second primary peak wavelength.

21. The method according to claim 12 comprising at least one of the following steps:

growing a color conversion resonator cavity on a substrate, wherein the substrate comprises a buffer structure;

one of depositing and growing at least one of the partially reflective region and further partially reflective on the substrate;

terminating a surface of an LED structure and a surface of the color conversion resonator cavity with a high density oxide film;

depositing bonding material;

bonding the color conversion resonator system to an LED structure using dialectric bonding;

removing at least one of the substrate and buffer structure by etching;

isolating the color conversion resonator cavity to form at least one pixel.

* * * * *